(12) United States Patent
Bogner et al.

(10) Patent No.: US 8,604,961 B1
(45) Date of Patent: Dec. 10, 2013

(54) RATIOMETRIC ADC CIRCUIT ARRANGEMENT

(75) Inventors: Peter Bogner, Wernberg (AT); Hubert Rothleitner, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/594,918

(22) Filed: Aug. 27, 2012

(51) Int. Cl.
*H03M 1/12* (2006.01)

(52) U.S. Cl.
USPC .......................................... 341/155; 341/118

(58) Field of Classification Search
USPC ................................... 341/155, 172, 118, 167
See application file for complete search history.

(56) References Cited

U.S. PATENT DOCUMENTS

| | | | | |
|---|---|---|---|---|
| 4,243,975 A | * | 1/1981 | Masuda et al. | 341/168 |
| 5,172,115 A | * | 12/1992 | Kerth et al. | 341/118 |
| 5,712,590 A | * | 1/1998 | Dries et al. | 327/539 |
| 6,417,700 B1 | * | 7/2002 | Hirata et al. | 327/72 |
| 7,498,787 B2 | * | 3/2009 | Leung et al. | 323/283 |
| 7,590,334 B2 | * | 9/2009 | Yabusaki et al. | 388/811 |
| 7,855,538 B2 | * | 12/2010 | Bo | 323/282 |

OTHER PUBLICATIONS http://patents.justia.com/field/341-154.html.

* cited by examiner

*Primary Examiner* — Peguy Jean Pierre

(57) ABSTRACT

In various embodiments an analog-to-digital converter arrangement is provided, which may include an input terminal configured to receive a signal to be converted; a reference terminal configured to receive a reference signal; a voltage domain specific reference terminal configured to receive a voltage domain specific reference signal; an analog-to-digital converter circuit coupled to the input terminal, the reference terminal, and to the voltage domain specific reference terminal configured to compare the signal to be converted with the voltage domain specific reference signal, thereby generating a first digital comparison signal, and to compare the reference signal with the voltage domain specific reference signal, thereby generating a second digital comparison signal; and a ratiometric circuit configured to determine a digitally converted signal of the signal to be converted using the first digital comparison signal and the second digital comparison signal.

25 Claims, 4 Drawing Sheets ved signal of the signal to be converted using the first digital comparison signal and the second digital comparison signal.

RATIOMETRIC ADC CIRCUIT ARRANGEMENT

TECHNICAL FIELD

Various embodiments generally relate to a ratiometric ADC (analog-to-digital) circuit arrangement.

BACKGROUND

Standard ADCs transform analog voltage input signals by comparing them to a reference voltage signal. The voltage used by the ADC as reference defines the full scale range of the conversion range. Typically, the digital output signal $D_{out}$ is defined by the ratio of the input voltage $V_{in}$ to be converted and the reference voltage $V_{ref}$:

$$D_{out} = 2^{n} * (V_{in}/V_{ref}),$$

wherein n corresponds to the digital length of the output signal word and thereby also specifies the resolution of the conversion process. The equation represents the desired digital result as an expected output for some applications. As may be seen, the digital result $D_{out}$ is based on a ratiometric value, i.e. a ratio, in this case the ratio between the input voltage $V_{in}$ to be converted and the reference voltage $V_{ref}$ which is typically provided by the application and may have a value of 3.3V or 5V for example.

In standard ADCs used for digitizing an analog input value, an external reference voltage is applied to the ADC. This external reference voltage is often derived from the reference voltage of the application into which the ADC is embedded into. Typically, that reference voltage may be for example 3.3V or 5V, and it may be generated by an external voltage regulator. Consequently, when designing the ADC devices/components (such as transistors and capacitors) which have a rated operating voltage of 3.3V or 5V may need to be used such that the external reference voltage $V_{ref}$ can be fed to the ADC core without the ADC core being damaged or producing bogus results. In other words, the core of the ADC is required to be capable to handle 3.3V or 5V.

Due to the usage of 3.3V or 5V signals, those types of ADCs implemented in a deep sub-micron technology require devices in the ADC core which are able to handle 5V signals. This may lead to a high area consumption of the ADC as devices designed for higher voltages tend to be larger. In addition, the speed of an ADC circuit is mainly dictated by the performance of high voltage devices which is lower compared to digital core logic devices which may typically operate with operating voltages in the core voltage domain of for example 1.5V or less.

SUMMARY

In various embodiments an analog-to-digital converter arrangement is provided, which may include an input terminal configured to receive a signal to be converted; a reference terminal configured to receive a reference signal; a voltage domain specific reference terminal configured to receive a voltage domain specific reference signal; an analog-to-digital converter circuit coupled to the input terminal, the reference terminal, and to the voltage domain specific reference terminal configured to compare the signal to be converted with the voltage domain specific reference signal, thereby generating a first digital comparison signal, and to compare the reference signal with the voltage domain specific reference signal, thereby generating a second digital comparison signal; and a ratiometric circuit configured to determine a digitally con-

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

A ratiometric ADC arrangement according to various embodiments may be implemented in a more compact fashion by reducing the reference voltage that is provided to the ADC arrangement to the range of the core voltage or the supply voltage of the ADC arrangement. The core voltage or the supply voltage of the digital core of the ADC arrangement which in the following will be also referred to as a voltage domain specific reference voltage (as belonging to the voltage domain of the core of the ADC arrangement) may typically be 1.5V or less. The ADC arrangement according to various embodiments may be implemented in hardware by using core devices/components only, i.e. devices/components such as transistors and/or capacitors which are designed to operate at voltages in the core domain of the ADC circuit, for example at 1.5V or less. If only core devices/components are used to implement the ADC circuit, the usual external reference voltage which is provided to the ADC core and may be in the range of 5V or more cannot be used for the ADC circuit simply because it exceeds the voltage range for which the ADC has been designed. In other words, the (external) reference voltage used by the ADC which usually corresponds to a reference voltage used outside of the core of the ADC and may for example correspond to 5V or more, needs to be lowered and therefore a different concept for providing a reference voltage to the ADC may have to be used. The final digital radiometric result may be obtained by multiplexing the input signal, i.e. the signal to be converted, and the (external) reference signal and thus calculating the digital output which corresponds to a ratio of the input signal to the (external) reference signal.

Figure 1:
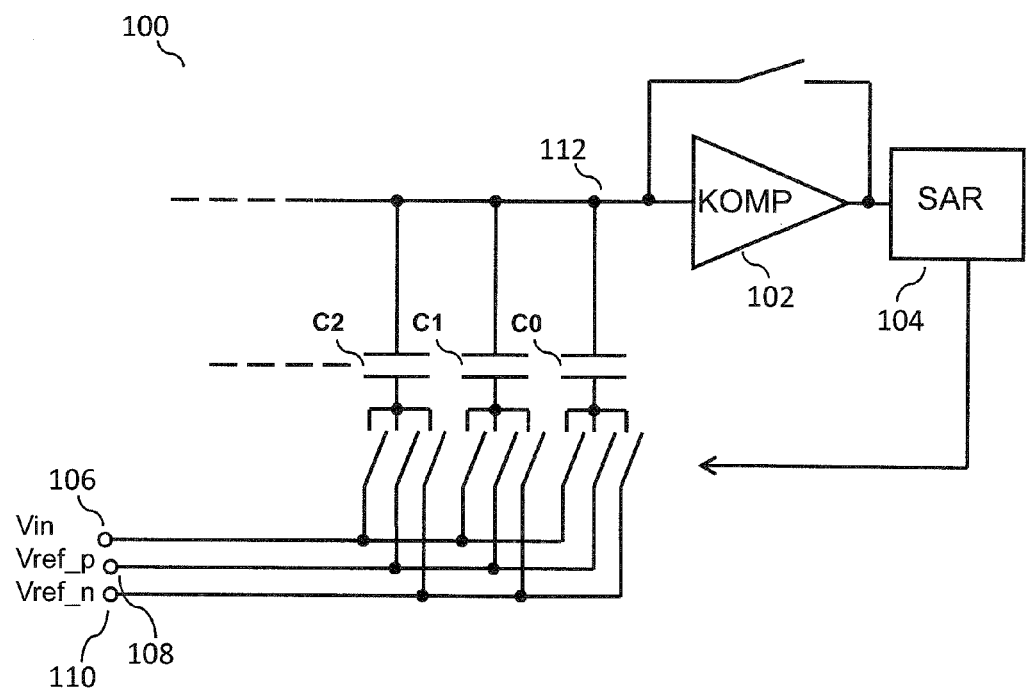
FIG. 1 shows an ordinary implementation of an ADC.

FIG. 1 shows an implementation of an ordinary ADC 100 in the form of a capacitive successive approximation ADC 100. The ADC 100 includes an array of binary weighted capacitors, a reference capacitor C0, a first capacitor C1, a second capacitor C2 and so on (in FIG. 1 only three capacitors of the array are shown) which may be individually switched. Beginning with the first capacitor C1, every following capacitor has a capacitance that is larger by a factor of 2, i.e. the first capacitor C1 has a capacitance C, the second capacitor C2 has a capacitance of 2 C, the third capacitance (not shown in FIG. 1) has a capacitance of 4 C, the fourth capacitance (not shown in FIG. 1) has a capacitance of 8 C and so on. The total number of capacitors present in the capacitor array is dictated by the desired resolution of the ADC 100. For example, the capacitor array of a 16 bit capacitive ADC would include 16 capacitors (and the extra reference capacitor C0), wherein the sixteenth capacitor C16 would have a capacitance of 32768 C. One side of each of the capacitors in the array of capacitors C0, C1, C2 is coupled to a summing node 112 of the ADC 100. The summing node 112 of the ADC 100 is coupled to an input of a comparator 102. An output of the comparator 102 is coupled to an SAR 104 (successive approximation register). The SAR 104 is coupled to an array of three-way switches, wherein each of the switches is allocated to one of the capacitors C0, C1, C2 in the array of capacitors. The ADC 100 has a first input 106 to which an input voltage Vin may be applied. The input voltage Vin may correspond to the signal to be converted. The ADC 100 further has a second input 108 to which a positive reference voltage Vref_p may be applied. The positive reference voltage Vref_p may be 5V, for example. The ADC 100 further has a third input 110 to which a negative reference voltage Vref_n may be applied. The negative reference voltage Vref_n may be 0V, for example, and it may define the zero voltage for the ADC 100. In the exemplary ADC 100 shown in FIG. 1 the (external) reference voltage Vref provided to and used by the ADC 100 corresponds to Vref=Vref_p−Vref_n. In the given example, the input voltage Vin representing the input signal to be converted may lie in the range from 0V to 5V and the reference signal may be 5V as well. Therefore, the core of the ADC 100 represented by the comparator 102 and the SAR 104 may need to be designed to handle voltages up to 5V which may lead to an increased size of the ADC 100 as devices/components such as transistors and capacitors which are designed for higher voltages (i.e. in this exemplary case designed to operate at voltages of up to 5V) usually have a larger size than low voltage devices/components which, for example, are designed to operate at low voltages of 1.5V or less. It should be mentioned that the implementation of the ordinary ADC 100 shown in FIG. 1 does not have a bandgap reference or other reference generation unit within the ADC 100 or even within the surrounding IC (integrated circuit) into which the ADC 100 may be embedded into. A bandgap voltage reference is a temperature independent voltage reference which may be provided by a reference circuit. The bandgap reference is usually derived from the theoretical bandgap of silicon at 0K which is located at 1.22 eV and in effect usually results in an reference voltage of 1.25V output by the reference circuit.

The functionality of the ADC 100 is based on the principle of charge redistribution. In the acquisition phase, every capacitor in the array of capacitors C0, C1, C2 is coupled to the first input 106 by the means of the switches allocated to the capacitors such that every capacitor in the array C0, C1, C2 is charged with the input voltage Vin. In effect, a charge proportional to the input voltage is trapped in the array of capacitors, the last capacitor in the array (having the largest capacitance) containing the most charges. Then, the amount of charge on each capacitor in the array of capacitors C0, C1, C2 is used to perform a binary search by the comparator 102 and the SAR 104 and the input voltage Vin may be converted into a digital output value with a resolution of n bits, n being the number of capacitors in the array of capacitors C0, C1, C2 and also the bit length of the of the digital output signal of the ADC 100.

Figure 2:
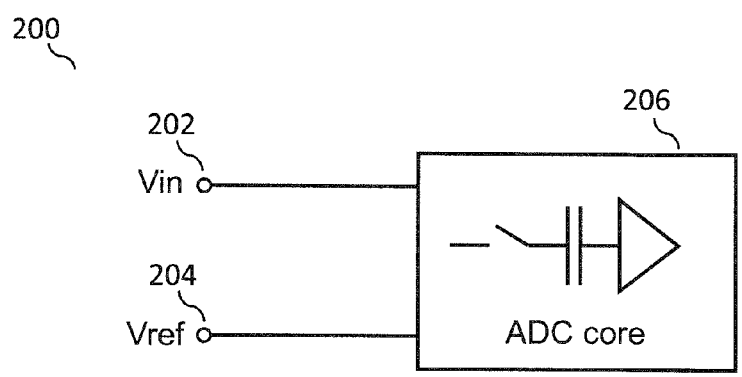
FIG. 2 shows a schematic of an ordinary ADC arrangement.

In FIG. 2, a schematic of an ordinary ADC arrangement 200 is shown. The ADC arrangement 200 includes the ADC 206 which is symbolically represented by a switch, a capacitor and a comparator, those devices being basic components of a conventional ADC. The ADC arrangement 200 has a first input 202 to which an input voltage Vin, i.e. the signal to be converted, may be applied. The ADC arrangement 200 further has a second input 202 to which the reference voltage Vref may be applied. The ADC arrangement 200 represents a conventional ADC which may be configured to calculate the ratiometric value, i.e. the ratio between the input voltage Vin and the reference voltage Vref. This calculation may be performed with a single step conversion. However, the ADC 206 receives the external reference voltage Vref such that it needs to be able to handle voltages which are larger than its (internal) voltages, for example the operating voltages of the devices such as capacitors and/or transistors in the core of the ADC 206. In this exemplary scenario, the input voltage Vin may have values ranging from 0V to 5V and the reference voltage may be 5V. Therefore, the core of the ADC 206 must be configured to be able to process those voltages and the ADC 206 cannot be fully implemented using core components/devices, i.e. components/devices such as capacitors and/or transistors which operate at core voltages of the ADC 206 which may for example lie in the range of 1.5V or less.

Figure 3:
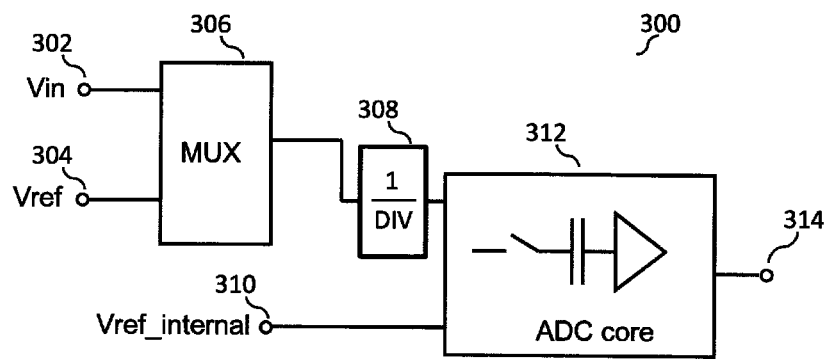
FIG. 3 shows a schematic of an ADC arrangement 300 according to various embodiments.

A schematic of an ADC arrangement 300 according to various embodiments is presented in FIG. 3. The ADC arrangement 300 according to various embodiments includes a first input 302 to which an input voltage Vin, i.e. the signal to be converted, may be applied. The ADC arrangement 300 according to various embodiments may further include a second input 304 to which a reference voltage Vref may be applied. Both the input voltage Vin and the reference voltage Vref may be derived from the same voltage domain which may be a voltage domain that is external from the point of view of the ADC 312 included in the ADC arrangement 300. The first input 302 and the second input 304 may be coupled to a multiplexer 306. An output of the multiplexer 306 may be coupled to a divider 308, an output of which may be coupled to a first input of the ADC 312. The divider 308 may be any dividing circuit which is configured to provide an output signal which is equivalent to a fraction of the signal provided at the input of the divider 308. The divider 308 may be configured as a resistive or as a capacitive divider, for example. The ADC 300 may further include a third input 310 to which a voltage domain specific reference signal/voltage Vref inernal may be applied. It needs to be mentioned that even though the divider 308 in FIG. 3 is displayed as a separate component or circuit, it may be also implemented into the ADC 312, e.g. as resistive or capacitive divider.

The voltage domain specific reference voltage Vref_internal may be in the range of the voltage which the core of the ADC 312 is configured to operate at and it may, for example, be 1.5V or less. In other words, the voltage domain specific reference voltage Vref_internal may lie in the voltage domain used by the core of the ADC 312, i.e. it may have the same maximal amplitude. The voltage specific reference voltage Vref_internal may be smaller than the (external) reference voltage Vref which may be used outside of the core of the ADC 312 and which may be applied to the second input 304. For example, the voltage domain specific reference voltage Vref_internal may be a bandgap reference voltage, i.e. it may be derived from a bandgap of a material such as silicon or it may be derived from a junction between two materials such as two semiconductors. The (external) reference voltage Vref may have an amplitude which is configured to cover the whole range of possible signal values of the input signal Vin and it may have a value of 5V or more, for example.

The conversion process of the ADC arrangement 300 according to various embodiments may be a two-step process. In a first step the multiplexer 306 may couple the first input 302 of the ADC arrangement 300 to the ADC 312 via the divider 308 such that the input voltage Vin may be determined with respect to the voltage domain specific reference voltage Vref_internal. The result of this first calculation process in the form of a first digital comparison signal (e.g. a first digital comparison word) may be stored in a first register (not shown in FIG. 3). In a second step the multiplexer 306 may be configured to couple the second input 304 to the ADC 312 via the divider 308 such that the reference voltage Vref may be determined with respect to the voltage domain specific reference voltage Vref_internal. The result of this second calculation process in the form of a second digital comparison signal (e.g. a second digital comparison word) may be stored in a second register (not shown in FIG. 3). A digital division circuit (not explicitly designated in FIG. 3) may generate the ratiometric value of the first digital comparison signal and the second digital comparison signal. This ratiometric value may correspond to the digitally converted signal of the signal to be converted. The ratiometric value may be provided at the output 314 of the ADC 312 for further processing which will be outlined later on. The ratiometric result may match the ratiometric result generated by the architecture of an ordinary ADC arrangement 200 as shown in FIG. 2. However, the ADC arrangement 300 shown in FIG. 3 performs the conversion in two separate calculation steps. The ADC 312 in the ADC arrangement 300 according to various embodiments, in contrast to the ADC 206 in the ADC arrangement 200 in FIG. 2, may be implemented using core devices/components only which may be area optimized, since the ADC 312 may use the voltage domain specific reference voltage Vref_internal instead of the usually larger (external) reference voltage Vref as the reference signal which is usually the case in ordinary ADC concepts.

The divider 308 may be configured such that its output signal has an amplitude which equal to or smaller than the voltage domain specific reference voltage. In other words, the divider 308 may be configured to convert the signals provided at its input, e.g. the input voltage Vin and/or the reference voltage Vref, from their voltage domain into the core voltage domain of the ADC 312 such that neither the input signal Vin nor the reference signal Vref has a larger amplitude than the voltage domain specific reference voltage Vref_internal used as reference by the ADC 312. For example, when the reference voltage corresponds to 5V and the input voltage Vin is expected to lie anywhere between 0V and 5V, the divider 308 may be configured to divide its input signals by four such that in this example both the input signal Vin and the reference signal Vref do not exceed 1.5V, which may correspond to an exemplary voltage domain specific reference voltage Vref_internal.

The ADC arrangement 300 shown in FIG. 3 may be also configured to calculate the absolute value of the input voltage Vin by reading out the digital value of the first register only which stores the first digital comparison word representing the input voltage Vin. In that case, the digital division circuit configured to provide the digital ratiometric value may perform a division by "1" instead of a division by the second digital comparison word stored in the second register and representing the (external) reference voltage Vref. The result of that calculation may be related to the voltage domain specific reference voltage Vref_internal with high accuracy, for example to an integrated reference voltage source (which may be bandgap voltage reference based, for example) provided within the ADC 312.

Figure 4:
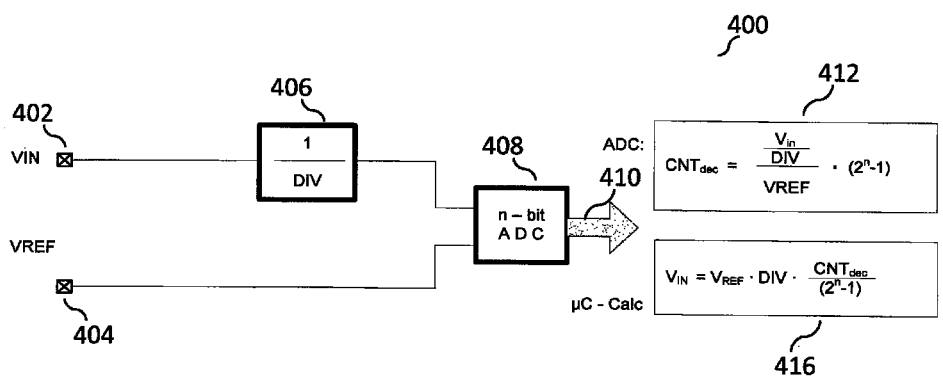
FIG. 4 shows an exemplary schematic layout of an ADC arrangement according to various embodiments.

FIG. 4 shows an exemplary schematic layout of the ADC arrangement 400 according to various embodiments which is based on the implementation shown in FIG. 3. The ADC arrangement 400 uses a further divider 406 which may be coupled between the first input 402 and the ADC 408 in order to handle input voltages Vin which may be larger than the (external) reference voltage Vref. The second input 404 to which the reference voltage Vref is provided may be coupled to the ADC 408 (e.g. the multiplexer provided therein). In this embodiment, the multiplexer and the divider preceding it (just as shown in the embodiment of the ADC arrangement 300 according to various embodiments shown in FIG. 3) are not shown. The ADC 408 may include the ADC core 312 from the ADC arrangement 300 according to various embodiments shown in FIG. 3. The divider 406 may be implemented as a resistive or as a capacitive divider, for example. The calculation pattern yielding the output 410 of the ADC 408 is displayed in the first box 412. The output 410 in the form of a digital word corresponds to the ratiometric value of the input voltage Vin divided by a division factor DIV as the dividend value and the (external) reference voltage Vref as the divisor value, that quotient being multiplied by $(2^n-1)$, wherein n corresponds to the bit length of the digital word representing the digitally converted signal of the signal to be converted Vin. The bit length n may be seen to also determine the resolution of the conversion process performed by the ADC arrangement 400 according to various embodiments shown in FIG. 4. In the second box 416 a calculation is shown which may be performed by a microcontroller to which the output 410 of the ADC 408 may be provided (or the microcontroller may be included in the ADC 408) to obtain an absolute digital value of the input voltage Vin. The microcontroller may be basically configured to divide the digital value provided at the output 410 of the ADC by $(2^n-1)$, to multiply it by the division factor DIV and then finally to multiply it by the reference voltage Vref. In other words, the microcontroller may be configured to perform the inverse calculation with respect to the ADC 408. Both calculations as displayed in the first box 412 and the second box 418 may be performed purely in the voltage domain of the ADC 408 or the core thereof, i.e. exclusively on hardware logic operating at operating voltages which lie in the core voltage domain of the ADC 408, for example at 1.5V or less.

Figure 5:
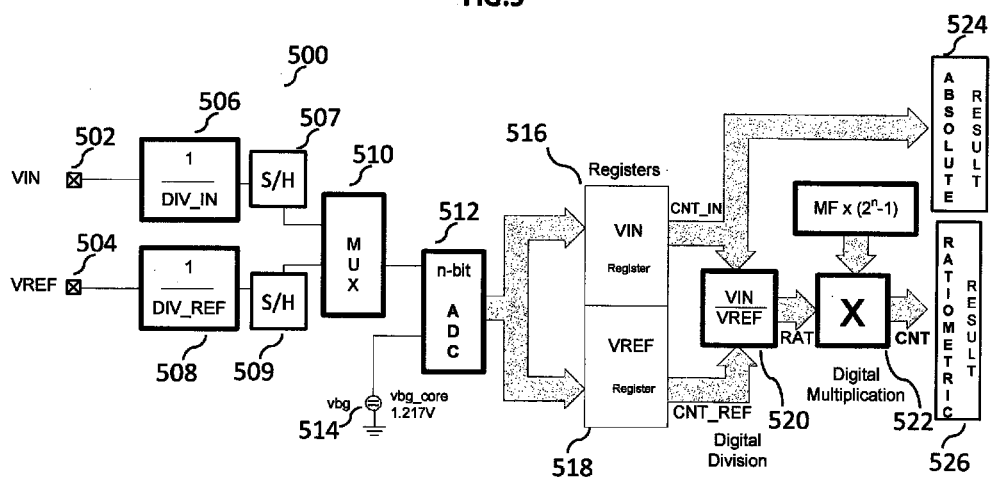
FIG. 5 shows a further exemplary schematic layout of an ADC arrangement according to various embodiments.

In FIG. 5 a further exemplary schematic layout of an ADC arrangement 500 according to various embodiments is shown which may be seen to be a more detailed description of the ADC arrangement 300 shown in FIG. 3.

The ADC arrangement 500 includes a first input 502 to which an input voltage Vin, i.e. the signal to be converted, may be provided and a second input 504 to which a reference signal Vref may be provided. The ADC arrangement 500 may further include a first divider 506 and a second divider 508. The first input 502 may be coupled to the first divider 506 such that the first divider 506 may receive the input voltage Vin and may output a fraction of the input voltage Vin. That is, the first divider 506 may be configured to divide its input signal by a predetermined factor DIV_IN. The second input 504 may be coupled to the second divider 508 such that the second divider 508 may receive the reference voltage Vref and may output a fraction of the reference voltage Vref. That is, the second divider 508 may be configured to divide its input signal by a predetermined factor DIV_REF. The output of the first divider 506 may be coupled to a first input of a multiplexer 510 via a first sample and hold stage 507. The output of the second divider 508 may be coupled to a second input of the multiplexer 510 via a second sample and hold stage 509. However, the sample and hold stages 507, 509 may be also provided between the respective inputs of the ADC converter 500 according to various embodiments and the dividers 506, 508. An output of the multiplexer 510 may be coupled to a first input of the ADC 512. A voltage domain specific reference signal Vbg_core may be applied to a second input of the multiplexer 512. The voltage domain specific reference signal Vbg_core may be, for example, derived from an integrated bandgap as already described above with reference to the description of FIG. 1. An output of the multiplexer 510 may be coupled to a first register 516 which may be configured to store the first digital comparison signal representing the converted input signal Vin referenced to the voltage domain specific reference signal Vbg_core. The output of the multiplexer 510 may be further coupled to a second register 518 which may be configured to store the second digital comparison signal representing the converted reference signal Vref. The first register 516 and/or the second register 518 may be provided in the form of D flip-flops, for example. Each of the registers may be coupled to a digital division circuit 520. The digital division circuit 520 is coupled to a digital multiplication circuit 522. The digital division circuit 520 and the digital multiplication circuit may be seen form a ratiometric circuit configured to determine a digitally converted signal of the signal to be converted Vin using the first digital comparison signal and the second digital comparison signal which are stored in the corresponding registers 516, 518.

In the following, the functionality of the ADC arrangement 500 will be described. The signal to be converted Vin may be applied to the first input 502. The (external) reference voltage Vref may be applied to the second input 504. The input voltage Vin and the reference voltage Vref may be seen to originate from an external voltage domain from the point of view of the ADC 512. For example, the input voltage may be expected to lie in the range from 0V to 10V and the reference voltage may be 10V. This is only one possible example, the input voltage Vin may lie in any range which may be usually dictated by an external circuit using the ADC arrangement 500 to digitize signals. The first divider 506 and the second divider 508 may be replaced by a single divider stage which may be arranged between the multiplexer 510 and the ADC 512 in analogy to the schematic of an ADC arrangement 300 according to various embodiments presented in FIG. 3. The first sample and hold stage 507 and the second sample and hold stage 509 may be triggered by a common signal and thus may be configured to sample the input voltage Vin and the reference voltage Vref, respectively, at the same time. In other words, the sample and hold stages make sure that single shot values from the signals applied to the first input 502 and the second input 504, respectively, are sampled at the same time and are therefore temporally correlated with one another. After the input voltage Vin to be converted has been acquired together with the reference value Vref, the multiplexer 512 may forward the input voltage Vin to the ADC 512 such that in a first processing step the ADC 512 may convert the input voltage Vin into a first digital comparison signal and store a digital word corresponding to that signal in the first register 516. The ADC 512 may be implemented using only devices/components which are configured to operate at operating voltage lying in the core voltage domain of the ADC 512, for example in the voltage domain of 1.5V or less. Hence for the calculation in the first process step, the voltage domain specific reference signal Vbg_core may be used as reference by the ADC 512. In other words, the first digital comparison signal representing the digitized input voltage Vin may correspond to the ratiometric value of the input voltage Vin divided by the voltage domain specific reference signal Vbg_core. The input voltage Vin may be prescaled appropriately, i.e. divided, by the first divider 506 such that the maximum amplitude of the input voltage Vin may be equal to or be smaller than the maximum amplitude of signals processed in the core domain of the ADC 512. In other words, the divided input voltage Vin may lie in the core voltage domain of the ADC 512. For example, if the voltage domain specific reference signal Vbg_core is 1.5V, the first divider 506 may be configured to divide the input voltage 512 such that its maximally expected value will not exceed 1.5V. In other words, the first divider may be seen to transform the input voltage Vin from its voltage domain into the voltage domain of the ADC 512. In a second process step, the same calculation is performed for the (external) reference value Vref, i.e. the ratiometric value of the reference voltage Vref with respect to the voltage domain specific reference signal Vbg_core may be calculated and the resulting second digital comparison signal may be stored in the second register 518 in the form of a digital word. In an analogous manner, the reference voltage Vref may be prescaled appropriately, i.e. divided, by the second divider 508 such that the reference voltage Vref may be equal to or be smaller than the voltage domain specific reference signal Vbg_core used by the ADC 512 as a reference signal. After the digital words representing the input signal Vin and the (external) reference signal Vref have been stored in their respective registers 516, 518 both digital words may be output to the digital division circuit 520. The digital division circuit 520 may be configured to calculate the ratiometric value of the input voltage Vin and the reference voltage Vref, i.e. the quotient Vin/Vref. In other words, the ratiometric value may be obtained from a division of the digital word corresponding to the first digital comparison signal stored in the first register 516 (representing the input voltage Vin) by the digital word corresponding to the second digital comparison signal stored in the second register 518 (representing the (external) reference voltage Vref). The result of this calculation may be passed to the digital multiplication circuit 522 which may be configured to multiply that digital ratiometric value by $(2^n-1)$ such that the final digital ratiometric result 526, i.e. the digitally converted signal of the signal to be converted Vin, may be obtained from the digital multiplication circuit 522.

The ADC arrangement 500 according to various embodiments may be further configured to read out the first register 516 and output the digital word representing the input voltage Vin. In other words, the ADC arrangement 500 may be configured to output an absolute result 524 which is related to the voltage domain specific reference signal Vbg_core with high accuracy.

The ADC arrangement 500 may further offer accurate and reliable calculation results due to inherent redundancy. The first register 516 is configured to store the first digital comparison signal, i.e. the ratio of the input voltage Vin and the voltage domain specific reference signal Vbg_core. The second register 518 is configured to store the second digital comparison signal, i.e. the ratio of the (external) reference voltage Vref and the voltage domain specific reference signal Vbg_core. The digital division circuit 520 is configured to provide the ratiometric value of the input voltage Vin and the reference voltage Vref. Those three independent values (all being quotients of three parameters) may be checked against each other to verify the consistency of the calculations performed by the ADC arrangement 512.

Figure 6:
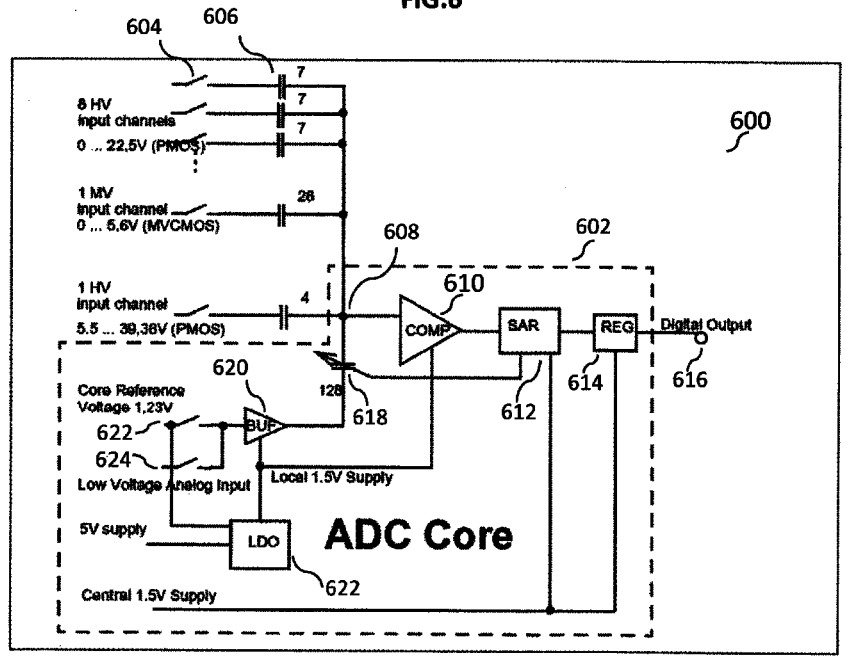
FIG. 6 shows an exemplary hardware implementation of the ADC arrangement 600 according to various embodiments.

In FIG. 6 an exemplary hardware implementation of the ADC arrangement 600 according to various embodiments is shown. The ADC arrangement 600 may include several input channels, for example high voltage input channels with input voltages in the range between 0V and 22.5V or between 5.5V and 39.96V, for example, and medium voltage input channels with input voltages in the range between 0V and 5.6V. In FIG. 6 each input channel may feature the same structure. Each input channel may include a switch 604 which may be used to select a point in time at which the respective signal is to be sampled. In each input channel the switch may be coupled to a corresponding capacitor 606, which may act as a divider in conjunction with a search capacitor 618. Although only one capacitor 606 is indicated in each of the input channels, a plurality of capacitors coupled in parallel may be provided in each input channel, their number being indicated to the upper right of the capacitor symbol. The number of the capacitances coupled in parallel in each input channel may be given by a magnitude of the input voltages applied to the corresponding input channel. The numbers given to the upper right of the capacitor symbols in FIG. 6 present just one exemplary setup of the input channels and of course may be changed according to the capacitances of the used capacitors and the magnitudes of the corresponding input voltages. Furthermore, each capacitor in the parallel arrangement of a respective input channel may include a series arrangement of capacitors, for example two capacitors, three capacitors or even more. In this example, the medium input voltage channel may represent the input channel to which the (external) reference voltage Vref may be applied and the high voltage input channels may represent the input channels to which input voltages Vin to be converted into digital values may be applied. All the input channels are coupled to a summing node 608 of the ADC core 602 provided in the ADC arrangement 600. The summing node 608 is coupled to an input of the comparator and to one side of a search capacitor 618 which may be a capacitor with variable capacitance. An output of the comparator 610 may be coupled to an SAR 612 which in turn may be coupled to a register 614. An output of the register 614 forms the digital output of the ADC core 602 and thereby the digitally converted signal of the signal to be converted Vin. Both the SAR 612 and the register 614 may be coupled to a central power supply and be provided with a voltage of 1.5V, for example. The ADC core 602 may further include a low dropout regulator 622 which is configured to generate a local supply voltage for the ADC core 602. For example, the low dropout regulator 622 may be configured to convert a supply voltage lying outside the core voltage domain, for example a supply voltage of 5V, into a lower local voltage, for example 1.5V, which may be used by the core devices/components of the ADC 602. The low dropout regulator 622 may be coupled to the comparator 610 and to a buffer 620. An output of the buffer 620 may be coupled to the other side of the search capacitor 618. The buffer 620 may include an input to which either the voltage domain specific reference signal 622, for example 1.23V derived from a bandgap reference, or a low voltage analog signal 624 may be applied.

The binary search in the ADC arrangement 600 is performed by the means of the search capacitor 618 which replaces the usually used array of binary weighted capacitors (see FIG. 1). The control terminal of the search capacitor 618 is coupled to the SAR 612 such that the capacitance value of the search capacitor 618 may be adjusted by the SAR 612. Once a selected input signal to be converted which is applied to an input channel has been converted by the comparator 610 and the SAR 612 it may be stored in the register 614.

The ADC core 602 included in the ADC arrangement 600 according to various embodiments may be entirely implemented in the core domain, for example at 1.5V. In other words, the ADC core 602 may be implemented in hardware using only components/devices which are designed to process voltages of up to 1.5V. This may reduce the size of the ADC core 602 as devices/components (such as transistors, capacitors) designed for low voltages tend to be smaller in comparison to equivalent devices/components which are designed to handle larger voltages. The voltage domain of the ADC core 602 which may be seen to be a low voltage domain according to various embodiments may extend past the summing node 608 up to the outputs of the (in this exemplary scenario) capacitive dividers such as the last capacitor 606 in the series arrangement of capacitors. The digital post-processing of the digital words stored in the register 614 is not shown in FIG. 6 as a corresponding explanation was already given with respect to the ADC arrangement 500 shown in FIG. 5.

Figure 7:
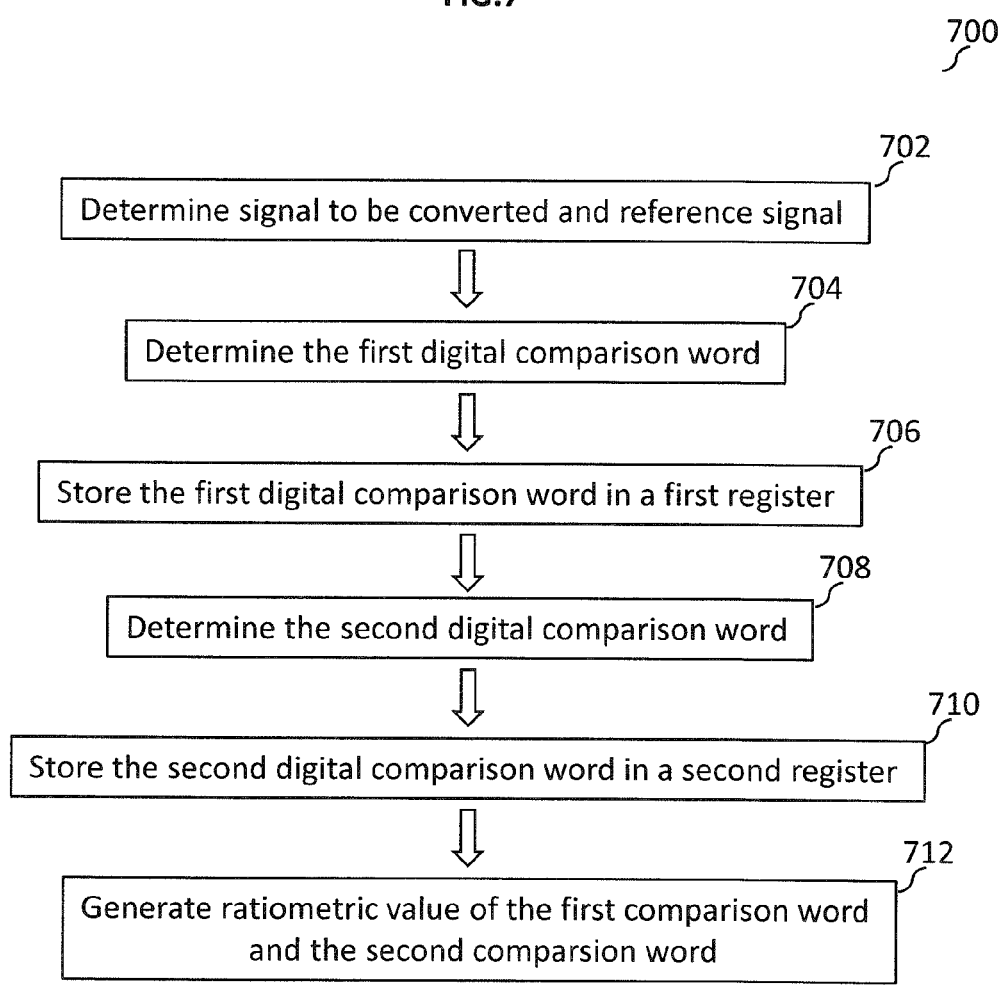
FIG. 7 shows a flow diagram 700 depicting a possible process flow in the ADC converter according to various embodiments.

In FIG. 7 a flow diagram 700 depicting a possible process flow in the ADC converter according to various embodiments is shown.

In a first step 702 the signal to be converted Vin and the reference signal Vref may be determined. Both signals may correspond to single shot values which may be acquired at the same time and be stored by a sample and hold stage.

In a second step 704 the first digital comparison word may be determined. The first digital comparison word may be obtained by means of the ADC by dividing the signal to be converted, for example the input voltage Vin, by the voltage domain specific reference signal Vref_internal. In a third step 706 that first digital comparison word may be stored in a first register.

In a fourth step 708 the second digital comparison word may be determined The second digital comparison word may be obtained by means of the ADC by dividing the reference signal Vref by the voltage domain specific reference signal Vref_internal. In a fifth step 710 that second digital comparison word may be stored in a second register. It is to be noted that the first digital comparison word and the second digital comparison word may be determined independently from one another in two separate processing steps and each of those digital signals (in the form of digital words) may be stored in a separate dedicated register. The order in which the digital comparison words are determined is arbitrary such that the second step 704 and the third step 706 may be also performed after the fourth step 708 and the fifth step 710 have been performed.

In a sixth step 712 the ratiometric value of the first comparison word and the second comparsion word may be generated, for example by the ratiometric circuit. That ratiometric value my correspond to the digitally converted signal of the signal to be converted Vin.

According to various embodiments an analog-to-digital converter arrangement is provided, which may include an input terminal configured to receive a signal to be converted; a reference terminal configured to receive a reference signal; a voltage domain specific reference terminal configured to receive a voltage domain specific reference signal; an analog-to-digital converter circuit coupled to the input terminal, the reference terminal, and to the voltage domain specific reference terminal configured to compare the signal to be converted with the domain specific reference signal, thereby generating a first digital comparison signal, and to compare the reference signal with the voltage domain specific reference signal, thereby generating a second digital comparison signal; and a ratiometric circuit configured to determine a digitally converted signal of the signal to be converted using the first digital comparison signal and the second digital comparison signal.

In accordance with further embodiments of the analog-to-digital converter arrangement the reference terminal may be configured to receive the reference signal, wherein the reference signal may originate from a different voltage domain than the voltage domain specific reference signal.

In accordance with further embodiments of the analog-to-digital converter arrangement the reference terminal may be configured to receive the reference signal which may have a larger amplitude than the voltage domain specific reference signal.

In accordance with further embodiments of the analog-to-digital converter arrangement the reference terminal may be configured to receive reference signals having an amplitude of 3.3V or more.

In accordance with further embodiments of the analog-to-digital converter arrangement the voltage domain specific reference terminal may be configured to receive voltage domain specific reference signals having an amplitude of 1.5V or less.

In accordance with further embodiments of the analog-to-digital converter arrangement the voltage domain specific reference terminal may be configured to receive voltage domain specific reference signals the voltage domain of which may correspond to the core voltage domain of the analog-to-digital converter circuit.

In accordance with further embodiments the analog-to-digital converter arrangement may include a first sample and hold circuit coupled to the input terminal and configured to sample and hold the signal to be converted.

In accordance with further embodiments the analog-to-digital converter arrangement may include a second sample and hold circuit coupled to the reference terminal and configured to sample and hold the reference signal, wherein the first sample and hold circuit and the second sample and hold circuit may be configured to sample the signal to be converted and the reference signal, respectively, at the same time.

In accordance with further embodiments the analog-to-digital converter arrangement may further include a first dividing circuit configured to divide the signal to be converted.

In accordance with further embodiments of the analog-to-digital converter arrangement the first dividing circuit may be coupled between the input terminal and the first sample and hold circuit.

In accordance with further embodiments of the analog-to-digital converter arrangement the first dividing circuit may be implemented in the analog-to-digital converter circuit.

In accordance with further embodiments of the analog-to-digital converter arrangement the first dividing circuit may include a resistive divider.

In accordance with further embodiments of the analog-to-digital converter arrangement the first dividing circuit may include a capacitive divider.

In accordance with further embodiments of the analog-to-digital converter arrangement the first dividing circuit may be configured to divide the signal to be converted such that the divided signal to be converted may have an amplitude which may be equal to or smaller than the voltage domain specific reference signal.

In accordance with further embodiments the analog-to-digital converter arrangement may further include a second dividing circuit coupled between the reference terminal and the second sample and hold circuit and configured to divide the reference signal.

In accordance with further embodiments of the analog-to-digital converter arrangement the second dividing circuit comprises a resistive divider.

In accordance with further embodiments of the analog-to-digital converter arrangement the second dividing circuit may include a capacitive divider.

In accordance with further embodiments of the analog-to-digital converter arrangement the divided reference signal may have an amplitude which is equal to or smaller than the voltage domain specific reference signal.

In accordance with further embodiments the analog-to-digital converter arrangement may include at least one further input terminal configured to receive a further signal to be converted, wherein the at least one further input terminal may be coupled to the analog-to-digital converter circuit.

In accordance with further embodiments the analog-to-digital converter arrangement may include a multiplexer configured to provide one of the signal to be converted, the reference signal and the at least one further input signal to the analog-to-digital converter circuit.

In accordance with further embodiments the analog-to-digital converter arrangement may further include a first register coupled to the analog-to-digital converter circuit and configured to store the first digital comparison signal.

In accordance with further embodiments the analog-to-digital converter arrangement may further include a second register coupled to the analog-to-digital converter circuit and configured to store the second digital comparison signal.

In accordance with further embodiments of the analog-to-digital converter arrangement the ratiometric circuit may be configured to divide the first comparison signal stored in a first register by the second comparison signal stored in a second register, thereby generating a quotient signal.

In accordance with further embodiments of the analog-to-digital converter arrangement the ratiometric circuit may be further configured to multiply the quotient signal with $(2^n-1)$, wherein n represents the bit length of the digital output signal of the analog-to-digital converter circuit.

In accordance with further embodiments of the analog-to-digital converter arrangement the analog-to-digital-converter arrangement may be configured to provide the first comparison signal as a digital output signal by only reading out the first register.

In accordance with further embodiments the analog-to-digital converter arrangement may further include a dividing circuit coupled between the multiplexer and the analog-to-digital converter circuit and configured to divide the output signal from the multiplexer and to provide the divided signal to the analog-to-digital converter circuit.

In various further embodiments an analog-to-digital converter circuit is provided, the circuit including a first input configured to receive a signal to be converted; a second input configured to receive an external reference signal; an analog-to-digital internal input configured to receive an analog-to-digital internal reference signal; an analog-to-digital converter coupled to the first input, the second input, and to the analog-to-digital internal input and configured to compare the signal to be converted with the analog-to-digital internal reference signal, thereby generating a first digital comparison signal, and to compare the external reference signal with the analog-to-digital internal reference signal, thereby generating a second digital comparison signal; and a ratiometric circuit configured to determine a digitally converted signal of the signal to be converted using the first digital comparison signal and the second digital comparison signal.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An analog-to-digital converter arrangement, comprising:
    an input terminal configured to receive a signal to be converted;
    a reference terminal configured to receive a reference signal;
    a voltage domain specific reference terminal configured to receive a voltage domain specific reference signal;
    an analog-to-digital converter circuit coupled to the input terminal, the reference terminal, and to the voltage domain specific reference terminal configured to compare the signal to be converted with the voltage domain specific reference signal, thereby generating a first digital comparison signal, and to compare the reference signal with the voltage domain specific reference signal, thereby generating a second digital comparison signal; and
    a ratiometric circuit configured to determine a digitally converted signal of the signal to be converted using the first digital comparison signal and the second digital comparison signal.

2. Analog-to-digital converter arrangement of claim 1,
    wherein the reference terminal is configured to receive the reference signal,
    wherein the reference signal originates from a different voltage domain than the voltage domain specific reference signal.

3. Analog-to-digital converter arrangement of claim 1,
    wherein the reference terminal is configured to receive the reference signal which has a larger amplitude than the voltage domain specific reference signal.

4. Analog-to-digital converter arrangement of claim 1,
    wherein the reference terminal is configured to receive reference signals having an amplitude of 3.3V or more.

5. Analog-to-digital converter arrangement of claim 1,
    wherein the voltage domain specific reference terminal is configured to receive voltage domain specific reference signals having an amplitude of 1.5V or less.

6. Analog-to-digital converter arrangement of claim 1,
    wherein the voltage domain specific reference terminal is configured to receive voltage domain specific reference signals the voltage domain of which corresponds to the core voltage domain of the analog-to-digital converter circuit.

7. Analog-to-digital converter arrangement of claim 1, further comprising:
    a first sample and hold circuit coupled to the input terminal and configured to sample and hold the signal to be converted.

8. Analog-to-digital converter arrangement of claim 7, further comprising:
    a second sample and hold circuit coupled to the reference terminal and configured to sample and hold the reference signal,
    wherein the first sample and hold circuit and the second sample and hold circuit are configured to sample the signal to be converted and the reference signal, respectively, at the same time.

9. Analog-to-digital converter arrangement of claim 1, further comprising:
    a first dividing circuit configured to divide the signal to be converted.

10. Analog-to-digital converter arrangement of claim 9,
    wherein the first dividing circuit is coupled between the input terminal and the first sample and hold circuit.

11. Analog-to-digital converter arrangement of claim 9,
    wherein the first dividing circuit is implemented in the analog-to-digital converter circuit.

12. Analog-to-digital converter arrangement of claim 9,
    wherein the first dividing circuit comprises a resistive or a capacitive divider.

13. Analog-to-digital converter arrangement of claim 9,
    wherein the first dividing circuit is configured to divide the signal to be converted such that the divided signal to be converted has an amplitude which is equal to or smaller than the voltage domain specific reference signal.

14. Analog-to-digital converter arrangement of claim 1, further comprising:
    a second dividing circuit coupled between the reference terminal and the second sample and hold circuit and configured to divide the reference signal.

15. Analog-to-digital converter arrangement of claim 14,
    wherein the second dividing circuit comprises a resistive divider or a capacitive divider.

16. Analog-to-digital converter arrangement of claim 14,
    wherein the divided reference signal has an amplitude which is equal to or smaller than the voltage domain specific reference signal.

17. Analog-to-digital converter arrangement of claim 1, further comprising:
    at least one further input terminal configured to receive a further signal to be converted, wherein the at least one further input terminal is coupled to the analog-to-digital converter circuit.

18. Analog-to-digital converter arrangement of claim 17, further comprising:
    a multiplexer configured to provide one of the signal to be converted, the reference signal and the at least one further input signal to the analog-to-digital converter circuit.

19. Analog-to-digital converter arrangement of claim 1, further comprising:
    a first register coupled to the analog-to-digital converter circuit and configured to store the first digital comparison signal.

20. Analog-to-digital converter arrangement of claim 19, wherein the analog-to-digital-converter arrangement is configured to provide the first comparison signal as a digital output signal by only reading out the first register.

21. Analog-to-digital converter arrangement of claim 1, further comprising:
a second register coupled to the analog-to-digital converter circuit and configured to store the second digital comparison signal.

22. Analog-to-digital converter arrangement of claim 1, wherein the ratiometric circuit is configured to divide the first comparison signal stored in a first register by the second comparison signal stored in a second register, thereby generating a quotient signal.

23. Analog-to-digital converter arrangement of claim 21, wherein the ratiometric circuit is further configured to multiply the quotient signal with $(2^n-1)$, wherein n represents the bit length of the digital output signal of the analog-to-digital converter circuit.

24. Analog-to-digital converter arrangement of claim 1, further comprising:
a dividing circuit coupled between the multiplexer and the analog-to-digital converter circuit and configured to divide the output signal from the multiplexer and to provide the divided signal to the analog-to-digital converter circuit.

25. An analog-to-digital converter circuit, comprising:
a first input configured to receive a signal to be converted;
a second input configured to receive an external reference signal;
an analog-to-digital internal input configured to receive an analog-to-digital internal reference signal;
an analog-to-digital converter coupled to the first input, the second input, and to the analog-to-digital internal input and configured to compare the signal to be converted with the analog-to-digital internal reference signal, thereby generating a first digital comparison signal, and to compare the external reference signal with the analog-to-digital internal reference signal, thereby generating a second digital comparison signal; and
a ratiometric circuit configured to determine a digitally converted signal of the signal to be converted using the first digital comparison signal and the second digital comparison signal.

* * * * *